United States Patent
Chung et al.

(10) Patent No.: US 11,787,966 B2
(45) Date of Patent: Oct. 17, 2023

(54) PASTE MANUFACTURING METHOD AND FLEXIBLE ELECTRODE MANUFACTURING METHOD USING THE SAME

(71) Applicant: Korea Institute of Science and Technology, Seoul (KR)

(72) Inventors: Seungjun Chung, Seoul (KR); Byeongmoon Lee, Seoul (KR); Hyunjoo Cho, Seoul (KR); Heesuk Kim, Seoul (KR); Phillip Lee, Seoul (KR); JeongGon Son, Seoul (KR); JaiKyeong Kim, Seoul (KR); Youngpyo Ko, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 17/567,991

(22) Filed: Jan. 4, 2022

(65) Prior Publication Data
US 2023/0010066 A1 Jan. 12, 2023

(30) Foreign Application Priority Data
Jul. 12, 2021 (KR) .......................... 10-2021-0090951

(51) Int. Cl.
| | |
|---|---|
| C09D 11/52 | (2014.01) |
| C01B 32/174 | (2017.01) |
| C09D 11/033 | (2014.01) |
| C09D 11/037 | (2014.01) |
| C09D 11/102 | (2014.01) |

(Continued)

(52) U.S. Cl.
CPC ............ *C09D 11/52* (2013.01); *C01B 32/174* (2017.08); *C09D 11/033* (2013.01); *C09D 11/037* (2013.01); *C09D 11/102* (2013.01); *H01B 1/22* (2013.01); *H01B 1/24* (2013.01); *H10K 71/00* (2023.02); *H10K 85/221* (2023.02); *C01B 2202/06* (2013.01); *C01B 2202/22* (2013.01); *H10K 71/611* (2023.02); *Y02P 70/50* (2015.11)

(58) Field of Classification Search
None
See application file for complete search history.

(56) References Cited

U.S. PATENT DOCUMENTS

| | | | | |
|---|---|---|---|---|
| 2018/0340102 | A1* | 11/2018 | Ruatta | C09J 11/04 |
| 2021/0017428 | A1* | 1/2021 | Abe | C09J 9/02 |
| 2021/0230398 | A1* | 7/2021 | Zhu | C08K 3/041 |

FOREIGN PATENT DOCUMENTS

| | | |
|---|---|---|
| KR | 10-1221780 B1 | 1/2013 |
| KR | 10-2013-0020429 A | 2/2013 |

(Continued)

*Primary Examiner* — Katie L. Hammer
(74) *Attorney, Agent, or Firm* — Studebaker & Brackett PC

(57) ABSTRACT

A method of manufacturing a paste according to various embodiments of the present disclosure for resolving the above-described problems is disclosed. The method of manufacturing a paste may include an operation of adding a metal conductor and a multi-walled carbon nanotube (MWCNT) to chloroform (CHCl₃) to produce a first mixture, an operation of adding polydimethylsiloxane (PDMS) to the first mixture to produce a second mixture, an operation of evaporating the chloroform in the second mixture to acquire a third mixture, and an operation of adding an additional additive to the third mixture to produce a paste.

7 Claims, 8 Drawing Sheets

(51) Int. Cl.
*H01B 1/22* (2006.01)
*H01B 1/24* (2006.01)
*H10K 71/00* (2023.01)
*H10K 85/20* (2023.01)
*H10K 71/60* (2023.01)

(56) References Cited

FOREIGN PATENT DOCUMENTS

| | | |
|---|---|---|
| KR | 10-1336321 B1 | 12/2013 |
| KR | 10-1414668 B1 | 7/2014 |
| KR | 10-2020-0069639 A | 6/2020 |

\* cited by examiner

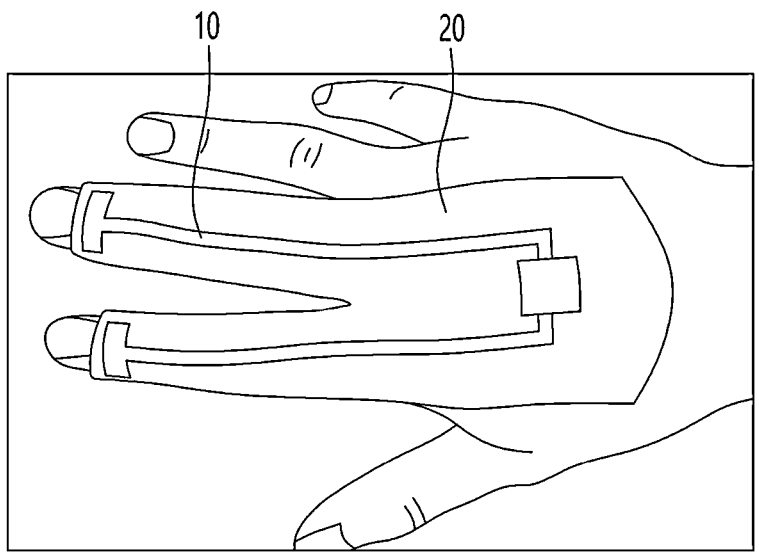
FIG. 3A
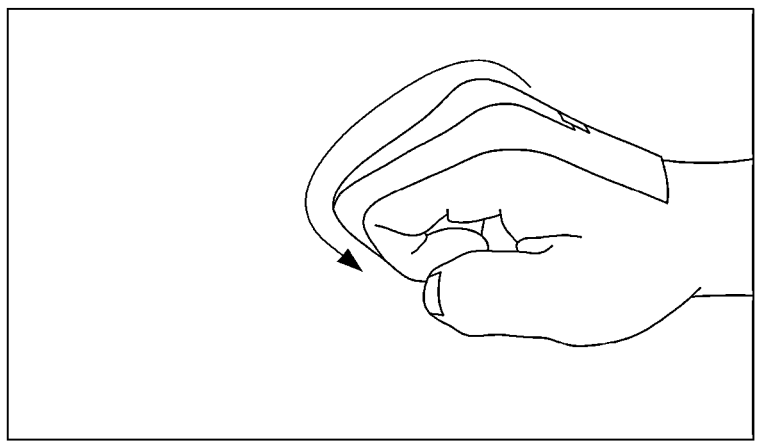
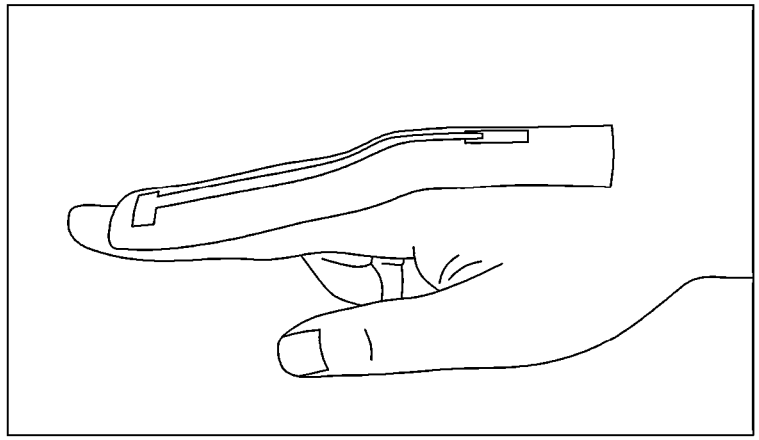
FIG. 3B

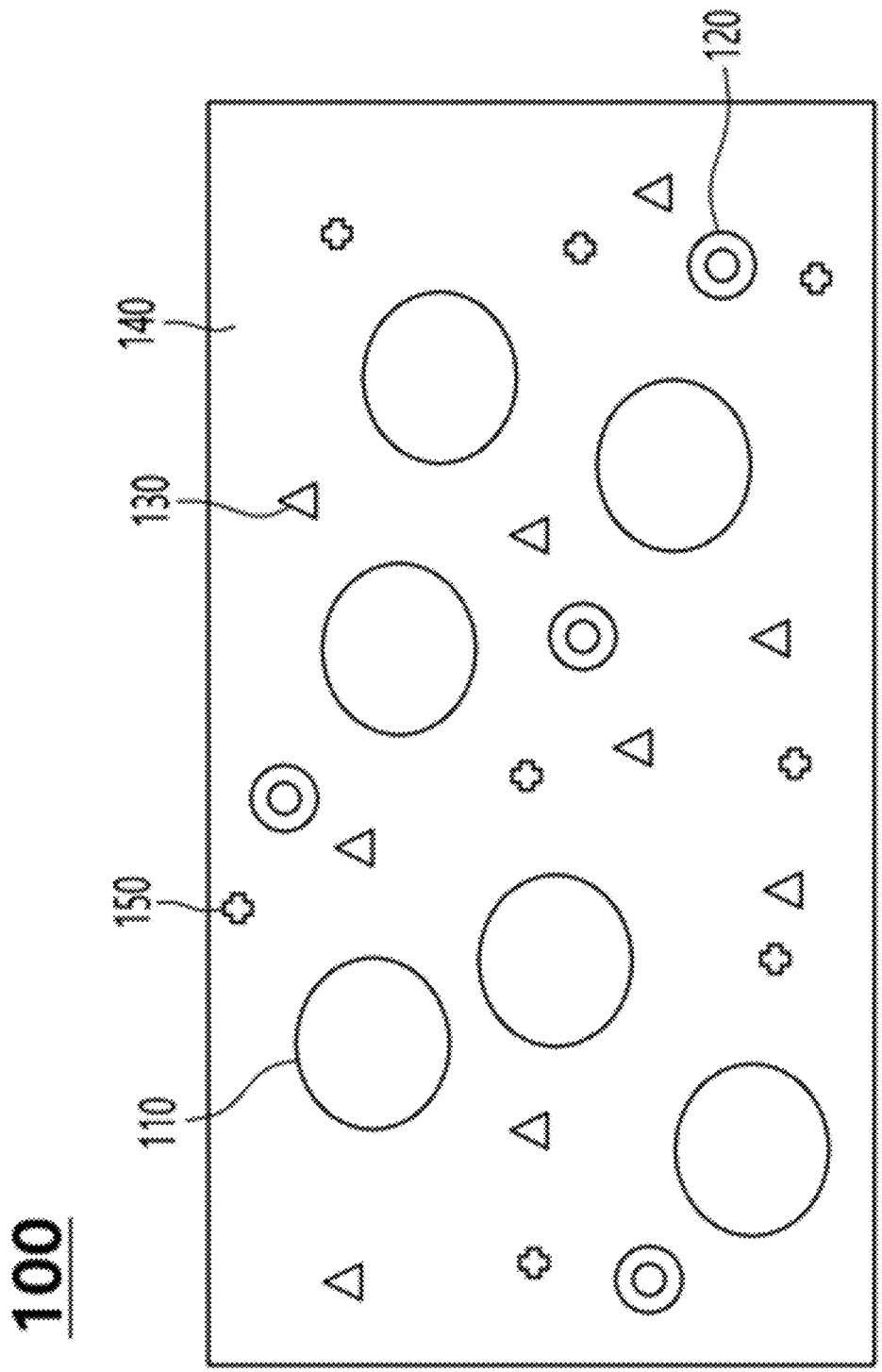

PASTE MANUFACTURING METHOD AND FLEXIBLE ELECTRODE MANUFACTURING METHOD USING THE SAME

CROSS-REFERENCE TO RELATED APPLICATION

This application claims priority to and the benefit of Korean Patent Application No. 10-2021-0090951, filed on Jul. 12, 2021, the disclosure of which is incorporated herein by reference in its entirety.

BACKGROUND

1. Field of the Invention

The present disclosure relates to an electrode paste having flexibility, and more specifically, to a flexible electrode exhibiting a stable resistance change rate by producing a printable paste having high conductivity and manufacturing an electrode through the paste.

2. Discussion of Related Art

Recently, research and development for a flexible electronic device in which an electrode is formed on a flexible substrate departing from a conductive element in which an electrode is formed on a rigid substrate has become active. A flexible electronic element is an electronic element manufactured on a substrate which can be freely elongated against external stress, and is a next-generation electronic element which maintains electrical/physical properties of the element even when mechanical strain or an external force is applied. Such a flexible electronic device can be applied to a flexible apparatus, a wearable apparatus, and the like, and further, can be used as a display, a sensor attached to the human body, an electrode, or the like.

The flexible electronic device can not only increase design freedom due to excellent mechanical variability but also secure mechanical stability due to an external force, and thus there is a trend in that the market is expanding to a wearable element, electronic skin, a smartphone, a medical device, a healthcare monitoring system, national defense, the aerospace industry, and the like. For example, the flexible electronic device requires high adaptability to be worn on a user's body, and accordingly, can be implemented in various form factors.

A flexible platform forming the flexible electronic device is composed of a flexible substrate, a flexible electrode, a flexible element, and among these, the flexible electrode is an important component of which electrical/physical properties should be maintained even when mechanical strain and stress are applied. The flexible electrode should be provided to have a multifaceted design to be linked with a substrate or elements within the flexible platform.

A complex is widely used as a material of the flexible electrode which implements the above-described characteristics best. For example, a complex composed of an elastomer and fillers has characteristics in which flexibility is high and a printing process is possible compared to other materials, but has a disadvantage in that electrical performance is somewhat low.

Such a complex can be implemented such that the content of conductive fillers is increased in order to improve the electrical performance to increase usability as an electrode. However, in the case of a complex in which the content of the conductive fillers is simply increased, mechanical stability is low, and in addition, there can be a limitation in that viscosity is high and thus it is difficult to implement a free design.

Accordingly, there may be a need in industry to develop a technology for a paste capable of implementing a low-resistance, high-stability flexible electrode.

SUMMARY

The present disclosure is directed to providing a paste capable of implementing a flexible electrode having low-resistance and high-stability.

The problems to be solved by the present disclosure are not limited to the above-mentioned problems, and other problems which are not mentioned will be clearly understood by those skilled in the art from the following disclosure.

A method of manufacturing a paste according to various embodiments of the present disclosure for realizing the above-described problems is disclosed. The method of manufacturing a paste includes an operation of adding a metal conductor and a multi-walled carbon nanotube (MWCNT) to chloroform ($CHCl_3$) to produce a first mixture, an operation of adding polydimethylsiloxane (PDMS) to the first mixture to produce a second mixture, an operation of evaporating the chloroform in the second mixture to acquire a third mixture, and an operation of adding an additional additive to the third mixture to produce a paste.

In an alternative embodiment, in the operation of producing the first mixture, the metal conductor and the MWCNT may be dispersed in the chloroform through sonication.

In an alternative embodiment, in the operation of producing the first mixture, the MWCNT may be included in an amount of 5 to 20 parts by weight relative to 100 parts by weight of the PDMS.

In an alternative embodiment, in the operation of producing the second mixture, the PDMS may be dispersed in the first mixture through a paste mixing process.

In an alternative embodiment, the operation of acquiring the third mixture may include acquiring the third mixture by performing a stirring process on the second mixture to cause room temperature evaporation of the chloroform.

In an alternative embodiment, the additional additive may be composed of a first combination of the chloroform and diethylene glycol (DEG), and the chloroform may be included at a greater mass than the DEG in the first combination.

In an alternative embodiment, the additional additive may be provided in an amount of 90 to 100 parts by weight relative to 100 parts by weight of the PDMS.

In an alternative embodiment, a ratio of the PDMS, the metal conductor, the chloroform, and the DEG constituting the paste may be 1:4:0.6:0.3.

In an alternative embodiment, the metal conductor may include silver (Ag) having conductivity and implemented as a plurality of microscale particles, and the silver constituting the paste may be provided in an amount of 230 to 400 parts by weight relative to 100 parts by weight of the PDMS.

In an alternative embodiment, an amount of the chloroform constituting the paste may be limited to 10 ml to 40 ml.

A paste for manufacturing a flexible electrode according to another embodiment of the present disclosure is disclosed. The paste includes a metal conductor having conductivity, a multi-walled carbon nanotube (MWCNT) having multiple walls and a nanostructure of a cylindrical shape, polydimethylsiloxane (PDMS) configured to adjust mechanical strength, chloroform used as a solvent, and diethylene glycol (DEG) used as an auxiliary solvent.

A flexible electrode manufacturing apparatus according to still another embodiment of the present disclosure is disclosed. The flexible electrode manufacturing apparatus may manufacture a flexible electrode through a printing process using the paste.

Other specific items of the present disclosure are included in the detailed descriptions and drawings.

BRIEF DESCRIPTION OF THE DRAWINGS

Various aspects are now described with reference to the drawings, wherein like reference numerals are used to generally refer to similar components. In the following embodiments, for purposes of description, numerous specific detailed items are presented to provide a thorough understanding of one or more aspects. However, it may be apparent that such aspect(s) may be performed without these detailed items.

FIGS. 3A and 3B are exemplary views illustrating an embodiment of a conventional flexible electrode according to one embodiment of the present disclosure;

FIG. 4 is an exemplary view illustrating a paste as a basis for manufacturing the flexible electrode according to one embodiment of the present disclosure;

DETAILED DESCRIPTION OF EXEMPLARY EMBODIMENTS

Figure 1:
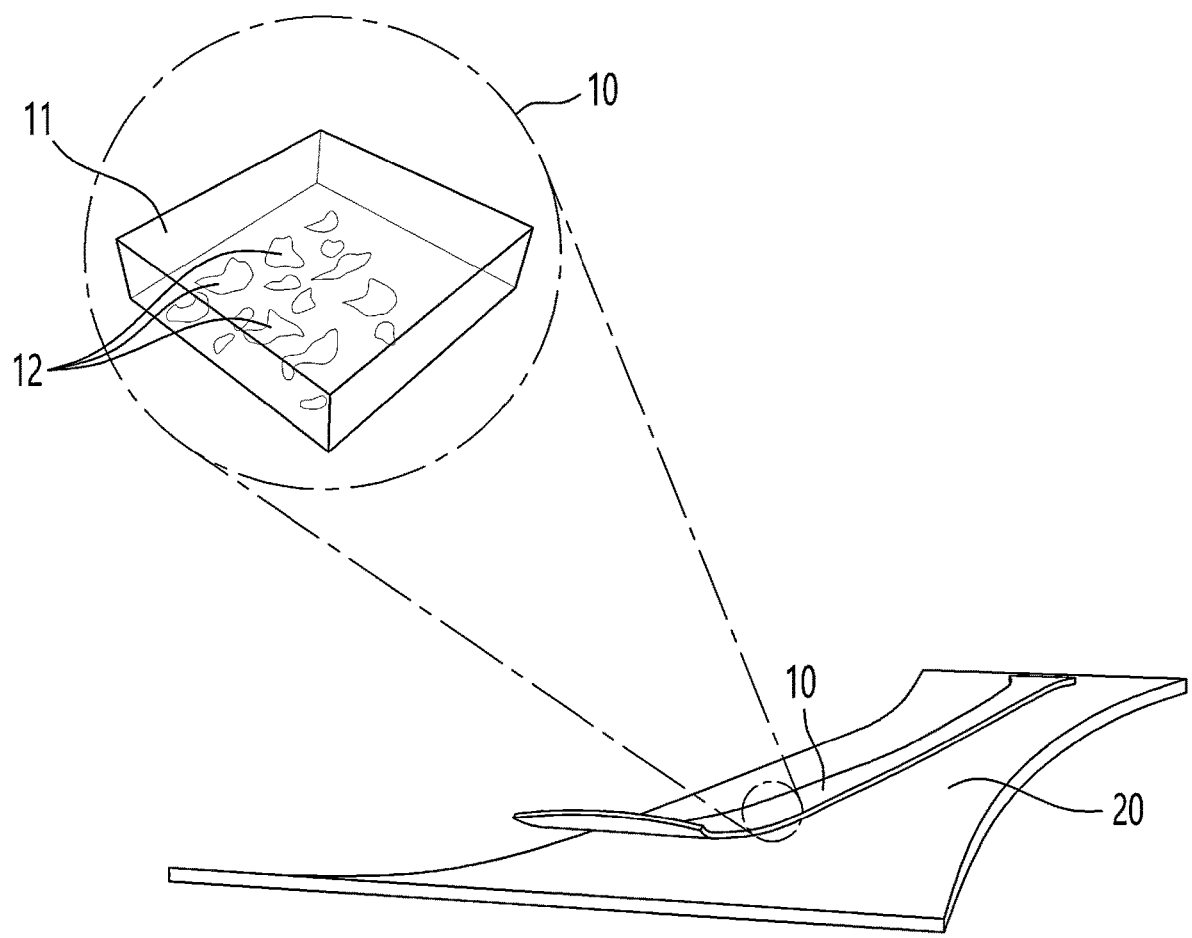
FIG. 1 is a view exemplarily illustrating a conventional flexible electrode configured through a paste related to a complex according to one embodiment of the present disclosure.

Various embodiments and/or aspects will be disclosed with reference to the drawings. In the following description, for purposes of the description, numerous specific detailed items are presented to help overall understanding of one or more aspects. However, it will also be appreciated by those skill in the art that the aspect(s) may be carried out without these detailed items. The following disclosure and the accompanying drawings disclose specific exemplary aspects of one or more aspects in detail. However, these aspects are exemplary, some of the various methods in the principles of the various aspects may be used, and the disclosed descriptions are intended to include all these aspects and their equivalents. Specifically, as used herein, "embodiment", "example", "aspect", "exemplary", and the like are not to be understood as any described aspect or design being better or more advantageous than other aspects or designs.

Here, the same reference numerals denote the same or similar components regardless of the reference numerals, and overlapping descriptions thereof will be omitted. Further, in the description of the embodiments disclosed in the specification, when it is determined that detailed descriptions of related known technologies may obscure the principle of the embodiments disclosed in the specification, the detailed description thereof will be omitted. In addition, the accompanying drawings are only for easy understanding of the embodiments disclosed in the specification, and the technical spirit disclosed in the specification is not limited by the accompanying drawings.

Although first, second, and the like are used to describe various elements or components, these elements or components are not limited by these terms. These terms are only used to distinguish one element or component from another. Accordingly, a first element or component to be mentioned below may be a second element or component within the spirit of the present disclosure.

Unless otherwise defined, all terms (including technical and scientific terms) used in the specification may be used with meanings which may be commonly understood by those skilled in the art. Further, terms defined in a commonly used dictionary are not to be interpreted ideally or excessively unless otherwise defined.

In addition, the term "or" is intended to mean an inclusive "or" rather than an exclusive "or." That is, unless otherwise specified or clear from context, "X uses A or B" is intended to mean one of the natural implicit substitutions. That is, when the X uses A, X uses B, or X uses both A and B, "X uses A or B" may be applied to either of these cases. It should also be understood that the term "and/or" as used herein refers to and includes all possible combinations of one or more of the listed related items.

Further, it should be understood that the terms "comprises" and/or "comprising" mean that the feature and/or component is present, but does not exclude the presence or addition of one or more other features, components, and/or groups thereof. In addition, unless otherwise specified or when it is not clear from the context as referring to a singular form, the singular form in the specification and claims should generally be construed to mean "one or more."

When a certain component is mentioned as being "connected" or "linked" to another component, it should be understood that the certain component may be directly connected or linked to the other component, but still another component may be present therebetween. On the other hand, when it is mentioned that the certain component is "directly connected" or "directly linked" to another element, it should be understood that there is no other certain component therebetween.

The suffixes "module" and "part" for the components used in the following description are given or mixed in consideration of only the ease of writing the specification, and do not have a distinct meaning or role by themselves.

Reference to an element or layer "above" or "on" another element or layer includes all cases in which another layer or another element is directly on as well as interposing another element or layer. On the other hand, a case in which an element is referred to as "directly on" or "immediately on" refers to a case in which another element or layer is not interposed therebetween.

Spatially relative terms "below", "beneath", "lower", "above", "upper", and the like be used to easily describe a component or a correlation with other components. The spatially relative terms should be understood as terms including different directions of an element during use or operation in addition to a direction shown in the drawings.

For example, when the components shown in the drawing are reversed, a component described as "below" or "beneath" another component may be placed "above" the other component. Accordingly, the exemplary term "below" may include both downward and upward directions. Components may also be oriented in other directions, and accordingly, spatially relative terms may be interpreted according to orientation.

Objects and effects of the present disclosure, and technical configurations for achieving them will be apparent with reference to the embodiments to be described later in detail with the accompanying drawings. In the description of the present disclosure, when it is determined that detailed descriptions of a well-known function or configuration may unnecessarily obscure the principle of the present disclosure, the detailed descriptions thereof will be omitted. Further, the terms to be described later are terms defined in consideration of functions in the present disclosure, and thus may vary according to intentions or customs of users and operators.

However, the present disclosure is not limited to the embodiments to be disclosed later and may be implemented in various different forms. Only the present embodiments are provided so that the present disclosure is complete, and to completely convey the scope of the disclosure to those skilled in the art, and the present disclosure is only defined by the scope of the claims. Accordingly, the definition should be made based on the content throughout the specification.

Recently, as research and development of a flexible electronic has become active, demand for technology development for a flexible electrode is increasing. The flexible electronic device refers to an elastic substrate which may be freely elongated against external stress, and an electronic element located on the elastic substrate, and may refer to an electronic device capable of maintaining electrical/physical properties of the element even when mechanical strain or an external force is applied For example, the flexible electronic device may not only increase design freedom due to excellent mechanical variability but also secure mechanical stability due to an external force, and thus there is a trend in that the market is expanding to a wearable element, electronic skin, a smartphone, a medical device, a healthcare monitoring system, national defense, the aerospace industry, and the like.

Generally, the flexible electronic device (or soft platform) may include a substrate, an electrode, a device, and the like having flexibility. In this flexible electronic device, the electrode transmits electrical energy to the electronic device, and is a very important component in configuring the flexible electronic device. Specifically, the electrode may refer to a terminal through which a current flows into or out of a conductor in a circuit. Since this electrode transmits the electrical energy to the electronic device, flexibility is a very important component in configuring the electronic device. When the flexible electronic device is elongated, the electrode provided in the flexible electronic device should also be elongated, and thus should be provided to have pliability or flexibility. That is, the flexible electrode should be provided to have high stability even under repeated elongation.

Further, the flexible electrode should be provided to have a multifaceted design to be linked with various types of flexible substrates or elements. For example, the flexible electrode may be provided on the flexible substrate through a printing process. Accordingly, the paste constituting the flexible electrode should be manufactured to have an appropriate viscosity and boiling point so that stable printing is possible. Here, the paste may refer to a material constituting the electrode. For example, the flexible electrode may be produced through a printing process using the paste.

A complex is present as a paste of a conventional flexible electrode which implements the above-described characteristics well. As a specific example, referring to FIG. 1, a flexible electrode 10 may be formed on an elastic substrate 20 through a printing process using a paste composed of the complex. Here, the elastic substrate 20 refers to a substrate having elasticity or flexibility, and may be implemented using, for example, silicone rubber, polyethylene naphthalate, a polyurethane polymer, or the like. Further, the flexible electrode 10 may be provided on one surface of the elastic substrate 20 through the printing process using the paste related to the complex.

The flexible electronic device implemented through the flexible electrode 10 and the elastic substrate 20 may be applied to a flexible device, a wearable device, and the like, and further, may be used as a display, a sensor attached to the human body, an electrode, or the like. As a specific example, as shown in FIGS. 3A and 3B, the flexible electronic device may be used as a flexible and durable electrically conductive patch attached to a user's body to acquire a biometric signal. For example, as shown in FIGS. 3A and 3B, the patch is implemented through the flexible electrode 10 and the elastic substrate 20, and may be attached to a user's hand to acquire a biometric signal related to the user. In this case, the patch may be elongated in response to a change according to movement of the user's body, as shown in FIG. 3B. That is, the patch may be exposed under continuous elongation, such as being elongated as the user's hand is bent, and then returning to an original state when the user's hand is extended. Like the above, when the elastic substrate 20 constituting the patch is elongated, the flexible electrode 10 provided on one surface of the transparent substrate 20 through the printing process should also be elongated.

Figure 2:
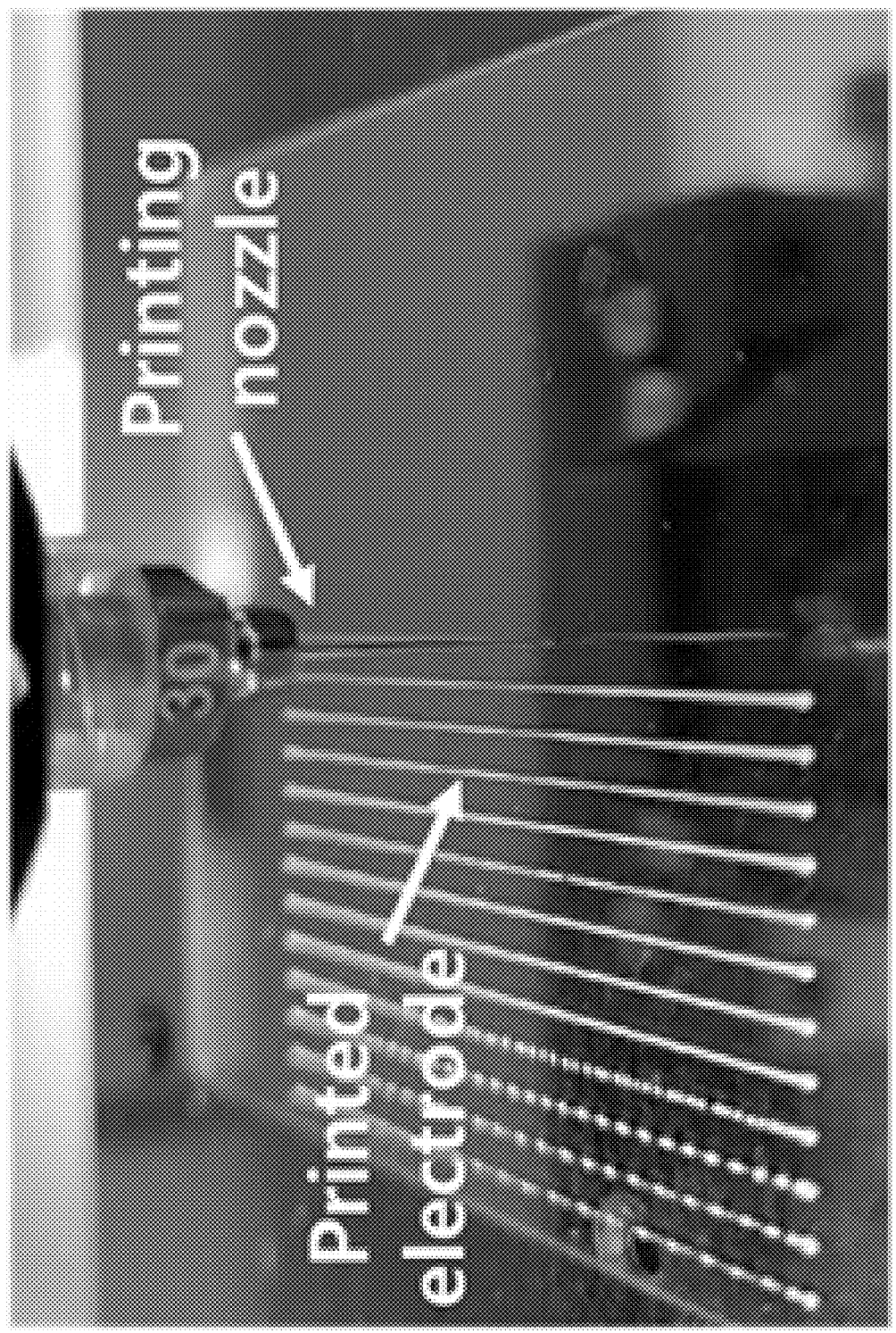
FIG. 2 is an exemplary view exemplarily illustrating a printing process for producing a flexible electrode according to one embodiment of the present disclosure.

As shown in FIG. 2, the printing process may refer to a printing process in which the electrode is produced by spraying the paste with a nozzle. The printing process is a process of printing a target object of a designed circuit pattern through an inkjet printer, a laminator, or the like and may refer to a roll-to-roll process which forms (or laminates) a specific lattice structure through a material having flexibility or elasticity. The printing process may refer to a process using equipment, for example, such as an inkjet, a pneumatic dispenser, a screw dispenser, a screen printer, a bar coater, a printer for stray printing, and the like. A specific disclosure of the above-described equipment used in the printing process is only an example, and the present disclosure is not limited thereto.

As a specific example, as shown in FIG. 1, the conventional flexible electrode 10 may be printed on the elastic substrate 20 through a paste including an elastomer 11 and silver 12. Here, the elastomer 11 is provided to impart flexibility to the flexible electrode, and may refer to a polymer having elasticity, that is, an elastomer. The elastomer 11 may be an elastic material in which a surface area is increased relative to an original length by an external force, and which recovers the original length in a short time as the external force is removed. For example, the elastomer 11 may include at least one of styrene-butadiene rubber (SBR), butadiene rubber (BR), synthetic rubber (HBR), nitrile rubber, fluorine rubber, chloroprene rubber (CR), EPM rubber, and silicone rubber. A specific disclosure of the above-described elastomer is only an example, and the present disclosure is not limited thereto.

Further, the silver 12 may be a conductor for imparting conductivity to the flexible electrode 10. As shown in FIG. 1, silver (Ag) having conductivity is provided in a flake shape, and thus, may maintain conductivity superior to that of a circular shape or other shapes when elongated.

That is, the conventional flexible electrode 10 may be produced through the printing process using the paste based on the complex including the elastomer 11 which imparts flexibility and the silver 12 which imparts conductivity.

However, the conventional flexible electrode 10 composed of the elastomer 11 and the silver 12 has high flexibility compared to other materials, and the printing process may be possible, but electrical performance may be somewhat low. In other words, the conventional flexible electrode 10 has an advantage of high flexibility and modulus adjustment, but has a disadvantage of low electrical performance.

Accordingly, in order to improve the electrical performance of the conventional flexible electrode 10, the content of a conductive filler, that is, the silver 12, may be increased when the paste is manufactured. That is, since the content of the silver 12, which is a conductive material, is increased in the paste that is the basis for production of the conventional flexible electrode 10, the electrical performance of the electrode manufactured from the paste may be improved.

However, in this case, due to an increase in the content of the conductive filler (that is, silver), the paste has high viscosity and a low boiling point, which may reduce a degree of integration on the flexible platform. As a more specific example, when the printing process in FIG. 2 is performed using the paste, clogging of a printing nozzle may be caused due to the high viscosity and low boiling point to reduce printing process efficiency.

That is, the paste which is the basis for production of the conventional flexible electrode 10 may be provided so that the content of the conductor is increased in order to secure high electrical conductivity, but as a result, the degree of integration or design freedom using the paste may be reduced. In addition, as the content of the conductive filler (that is, silver) increases, since the flexibility of the conventional electrode 10 implemented through the corresponding paste decreases, there is a concern that mechanical stability may not be ensured.

Accordingly, the present disclosure may provide a flexible paste 100 having improved stability (or flexibility) and conductivity. In addition, the paste 100 of the present disclosure may be implemented through low viscosity and a high boiling point so that a stable printing process is possible.

That is, in the case in which the flexible electrode is manufactured through the paste 100 of the present disclosure, it is possible to improve design freedom by enabling fine patterning, guarantee mechanical stability due to an external force, and secure improved electrical conductivity.

As shown in FIG. 4, the paste 100 of the present disclosure may include a metal conductor 110 having conductivity, a multi-walled carbon nanotube (MWCNT) 120 having multiple walls and a nanostructure of a cylindrical shape, polydimethylsiloxane (PDMS) 130 which adjusts mechanical strength, chloroform 140 used as a solvent, and diethylene glycol (DEG) 150 used as an auxiliary solvent.

Specific components constituting the paste 100 of the present disclosure and specific descriptions of effects expressed through each component will be described later with reference to FIGS. 5 to 8.

Figure 5:
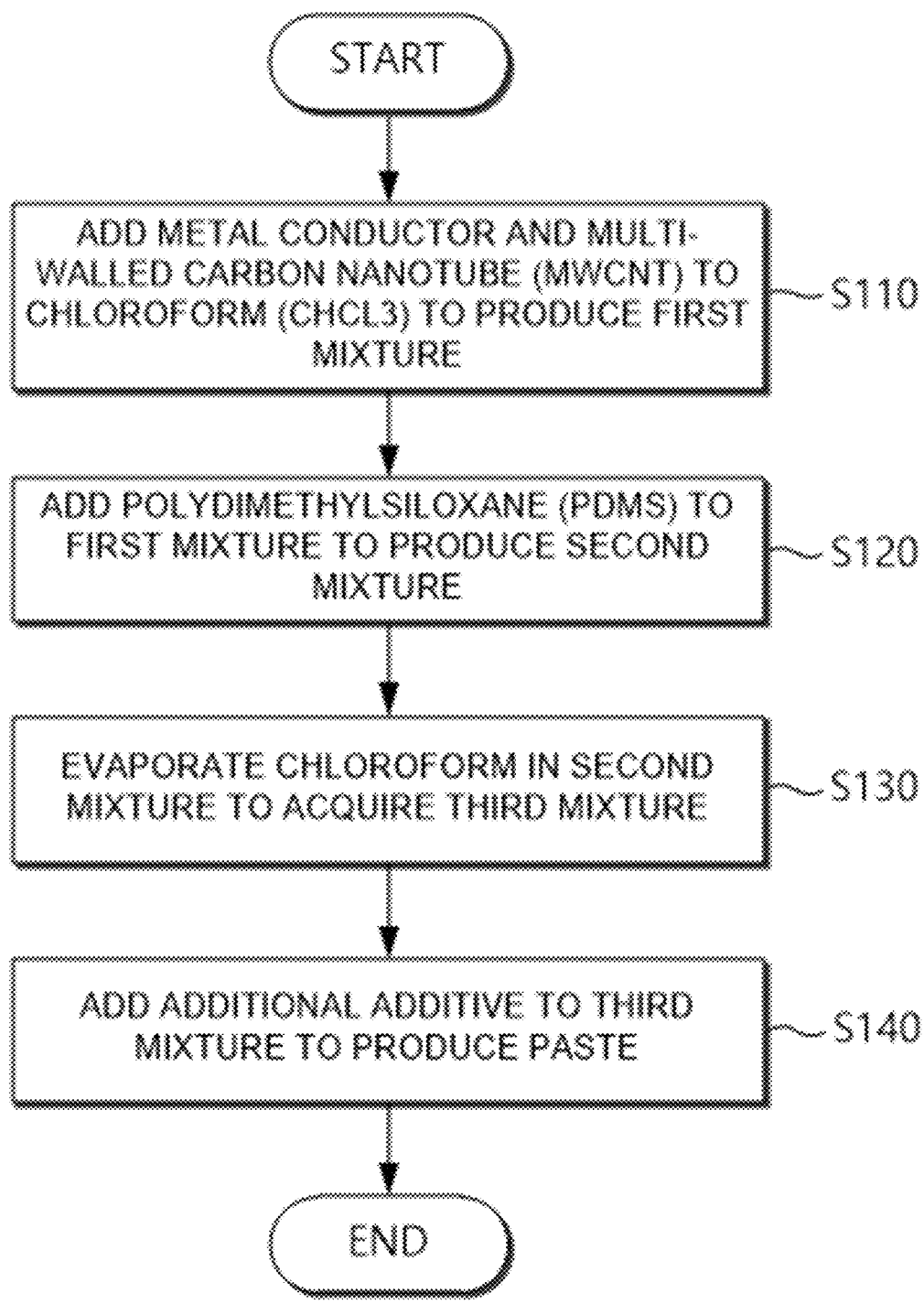
FIG. 5 is a flowchart exemplarily illustrating a method of manufacturing a paste according to one embodiment of the present disclosure.
Figure 6B:
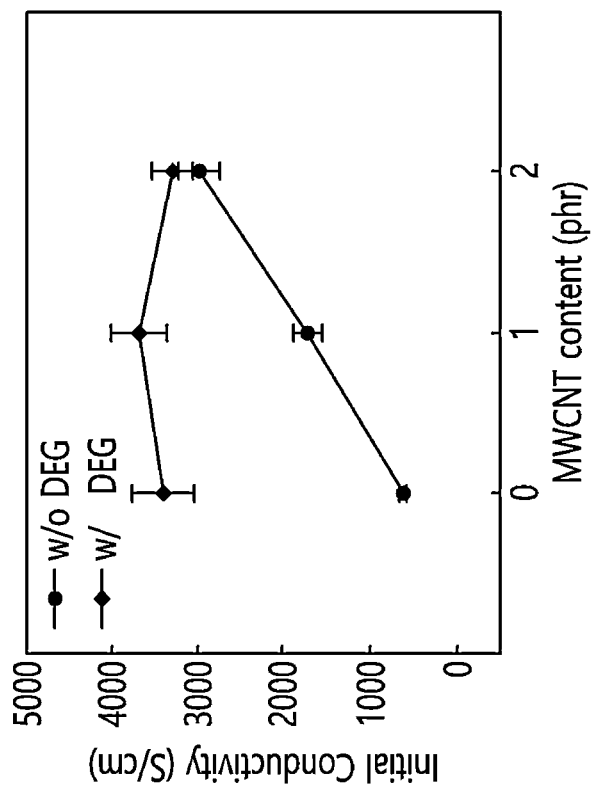
FIGS. 6A and 6B are views illustrating experimental results related to electrical performance of the paste according to one embodiment of the present disclosure.
Figure 6A:
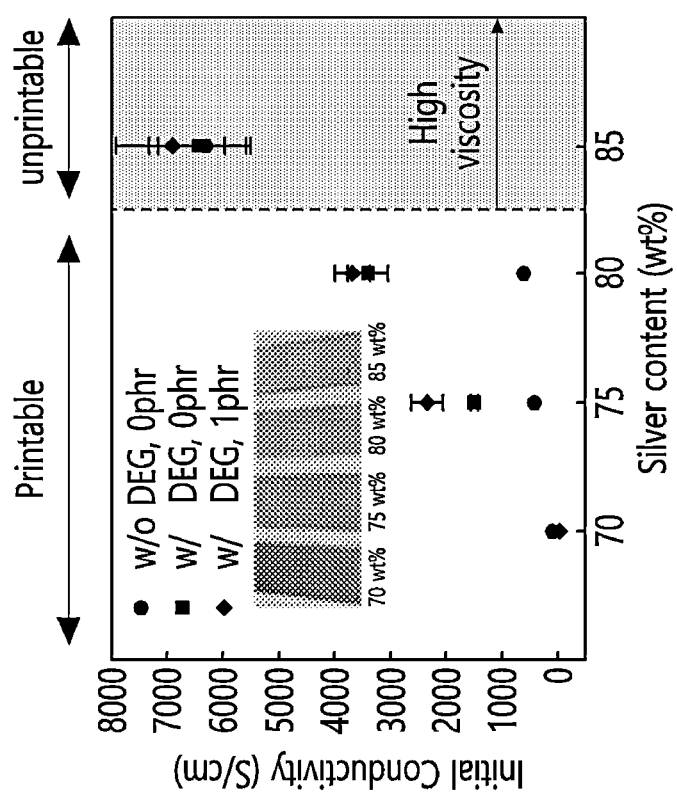
Figure 7B:
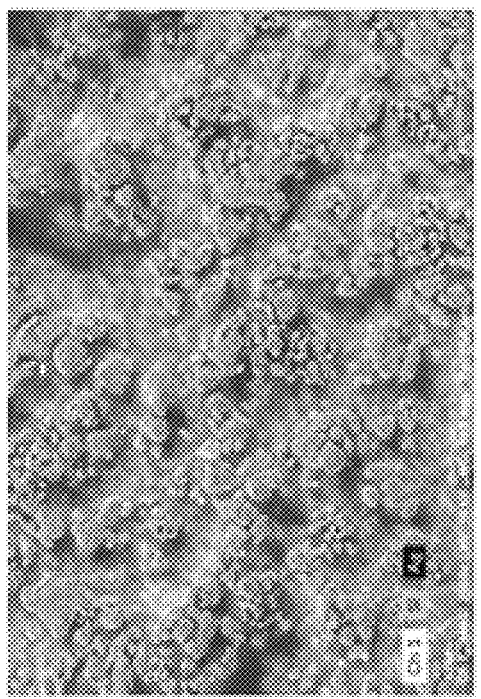
FIGS. 7A and 7B are views illustrating experimental results related to a change in electrical conductivity according to whether or not diethylene glycol (DEG) according to one embodiment of the present disclosure is included.
Figure 7A:
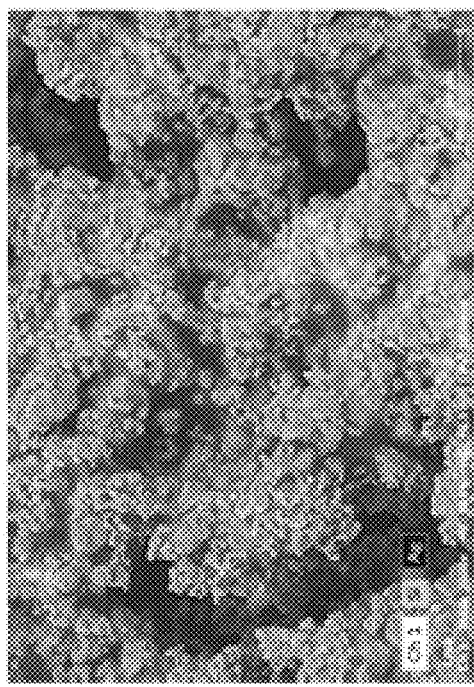
Figure 8:
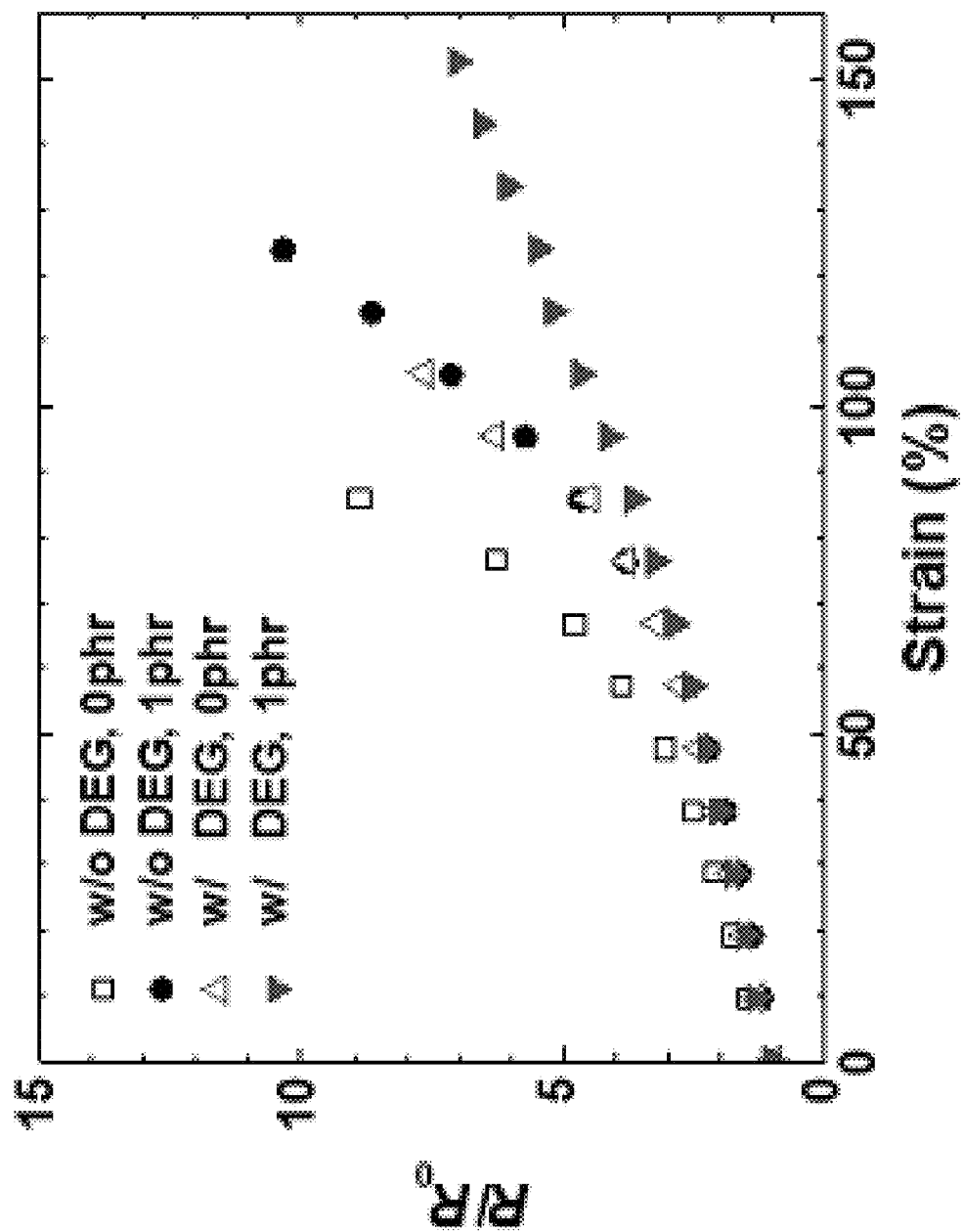
FIG. 8 is a view illustrating experimental results exhibiting that the flexible electrode according to one embodiment of the present disclosure has stability during an elongating process.

FIG. 5 is a flowchart exemplarily illustrating a method of manufacturing a paste according to one embodiment of the present disclosure. FIGS. 6A and 6B are views illustrating experimental results related to electrical performance of the paste according to one embodiment of the present disclosure. FIGS. 7A and 7B are views illustrating experimental results related to a change in electrical conductivity according to whether or not DEG according to one embodiment of the present disclosure is included. FIG. 8 is a view illustrating experimental results exhibiting that a flexible electrode according to one embodiment of the present disclosure has stability during an elongating process.

According to one embodiment, the paste manufacturing method may include the following operations. The order of the operations shown in FIG. 5 may be changed as necessary, and at least one or more operations may be omitted or added. That is, the following operations are merely one embodiment of the present disclosure, and the scope of the present disclosure is not limited thereto.

According to one embodiment of the present disclosure, the paste manufacturing method may include an operation of adding the metal conductor 110 and the MWCNT 120 to the chloroform ($CHCl_3$) 140 to produce a first mixture (S110). The chloroform 140 of the present disclosure is a compound composed of carbon and chlorine, and for example, may refer to a commonly used solvent. According to one embodiment, the chloroform 140 may be used as a solvent for mixing other components in a process of manufacturing the paste 100. For example, when the paste 100 is manufactured, appropriate arrangement or an appropriate interval between the components may contribute to improving electrical performance and mechanical stability. In one embodiment, the chloroform 140 may improve the electrical conductivity and the mechanical stability of the paste 100 by rearranging the interval between the components (that is, metal conductor, MWCNT, PDMS, and DEG). That is, the metal conductor 110, the MWCNT 120, the PDMS 130, and the DEG 150 may be easily mixed through the chloroform 140 to form the paste 100 of the present disclosure.

The metal conductor 110 may refer to a material which imparts conductivity to the flexible electrode. The metal conductor 110 has conductivity and may be implemented through a plurality of micro-sized particles. Here, the plurality of particles may mean that a conductor having conductivity is provided in a shape of a plurality of flakes. According to one embodiment, each flake may have a thickness of 1 to 4 µm. Further, in each flake, a horizontal length may be provided in a range of 1 to 4 µm, a vertical length may be provided in a range of 1.5 to 2.5 µm, and a length ratio related to the horizontal length and the vertical length may be 1:1 to 1:3. In one embodiment, as the conductor having conductivity is provided in the flake shape, when the conductor is elongated by an external force, it is possible to provide better conductivity than a circular shape or other shapes. The metal conductor 110 may include, for example, at least one of silver (Ag), gold (Au), copper (Cu), and iron (Fe). A specific disclosure of the above-described metal conductor is only an example, and the present disclosure is not limited thereto.

The MWCNT 120 may refer to a material having multiple walls and a nanostructure of a cylindrical shape. The MWCNT 120 may be configured in a tube shape with several layers of walls composed of carbon atoms in one tube. That is, the MWCNT 120 may be configured as one or more carbon nanotubes form the multiple walls. In this case, one carbon nanotube has a hollow inside in a cylindrical shape, and thus may be a material which is lightweight and has excellent pliability. That is, the MWCNT 120 may be a material having excellent mechanical properties. According to an additional embodiment, the MWCNT 120 may have a high electrical conductivity similar to that of copper, and accordingly, the overall electrical performance of the paste 100 may be improved.

According to one embodiment, the operation of producing the first mixture may be characterized in that the metal conductor 110 and the MWCNT 120 are dispersed in the chloroform 140 through sonication. That is, it is possible to uniformly disperse the metal conductor 110 and the MWCNT 120 in the chloroform 140 through ultrasonication using the sonication. When the metal conductor 110 and the MWCNT 120 are disposed to be dispersed in the chloroform 140, the conductivity and flexibility of the produced paste 100 may be further improved.

According to one embodiment of the present disclosure, the paste manufacturing method may include an operation of adding the PDMS 130 to the first mixture to produce a second mixture (S120). The PDMS 130 is a material with elastic flexibility, and may have high stretchability. For example, stretching performance of the paste 100 may be improved as a proportion of the PDMS 130 in the paste 100 increases, and the stretching performance of the paste 100 may be degraded as the proportion of the PDMS 130 in the paste 100 decreases. That is, as the PDMS 130 is included in the paste 100, the overall mechanical strength of the paste 100 may be adjusted. In an additional embodiment, a flexible material other than the PDMS may be included in the first mixture to constitute the second mixture. For example, as at least one of Ecoflex and polyurethane (PU) is added to the first mixture, the second mixture may be produced.

In one embodiment, the PDMS 130 may be dispersed in the first mixture through a paste mixing process. The paste mixing process is a mixing process performed through a paste mixer, and may be provided to disperse the PDMS 130 in the first mixture composed of the chloroform 140, the metal conductor 110, and the MWCNT 120. Through the paste mixing process, the PDMS 130 may be disposed to be dispersed in the first mixture, and accordingly, when the electrode is manufactured through the paste 100, the electrical performance of the flexible electrode may be improved.

According to one embodiment of the present disclosure, the paste manufacturing method may include an operation of evaporating the chloroform 140 from the second mixture to acquire a third mixture (S130). Specifically, the third mixture may be acquired by performing a stirring process on the second mixture to cause room temperature evaporation of the chloroform 140. That is, as the chloroform 140 is evaporated at room temperature on the existing second mixture through the stirring process, the third mixture may include the metal conductor 110, the MWCNT 120, and the PDMS 130.

According to one embodiment, the third mixture may be acquired by evaporating the chloroform 140 to clearly have a proportion of the chloroform 140 in the paste 100. The chloroform 140 of the present disclosure is provided to facilitate mixing between the components, and may also improve the conductivity and the mechanical stability of the paste 100. Since the chloroform 140 affects the overall electrical conductivity and flexibility (or mechanical strength) of the paste 100, a provision proportion may be very important.

That is, in the operations S110 and S120, the chloroform 140 is used for easy mixing between the components, and in the operation S130, the chloroform 140 may be evaporated at room temperature. Further, the proportion in which the chloroform 140 is provided (or constituted) in the paste 100 may become clear by adding the chloroform 140 in a correct amount or in a correct proportion again in the operation S140. Through this process, the finished paste 100 has an accurate proportion of the chloroform 140, and as a result, the conductivity and the mechanical strength thereof may be improved. Detailed descriptions of the characteristics of improving the conductivity and mechanical strength of the paste according to the proportion of the chloroform in the paste, the proportions of other components, and the proportion of each component will be described later.

According to one embodiment of the present disclosure, the paste manufacturing method may include an operation of adding an additional additive to the third mixture to produce a paste (S140).

The additional additive may be formed through a first combination of the chloroform 140 and the diethylene glycol (DEG) 150. Here, in the first combination, the chloroform may be composed of a larger mass compared to the DEG. For example, the first combination may be characterized in that a combination ratio of the chloroform 140 and the DEG 150 is 2:1. In the embodiment, a case in which the combination ratio between the chloroform 140 and the DEG 150 constituting the additional additive is 2:1 may be an optimal condition in consideration of dispersion and viscosity. For example, the chloroform 140 and the DEG 150 may be provided in amounts of 0.6 g and 0.3 g, respectively, relative to 1 g of the PDMS 130. That is, the additional additive may be provided in an amount of 90 to 100 parts by weight based on 100 parts by weight of the PDMS. As a specific example, the additional additive composed of the chloroform 140 and the DEG 150 relative to 1 g of the PDMS 130 may be provided in an amount of 0.9 g to 1 g. For example, when the amount of the additional additive is less than 0.9 g, or more than 1 g, an unsuitable viscosity or degree of dispersion of the paste 100 to be manufactured may be caused. On the other hand, the first combination may be formed so that the chloroform may have a specific gravity or mass which is greater than that of the DEG.

Specifically, when the amount of the additional additive is 90 parts by weight or less relative to 100 weigh parts of PDMS, the viscosity of the paste 100 to be manufactured may be improved. For example, when the amount of the additional additive is relatively small (that is, 90 parts by weight or less), the amount of the DEG 150 included therein is reduced, and accordingly, the amount of the DEG 150 included in the paste 100 is reduced, causing the addition of more metal conductor 110 (for example, addition of 80 wt % or more of silver) to secure electrical conductivity (for example, 3460 S/cm) of a certain level or more. Accordingly, as the viscosity of the paste 100 increases, the printing process may be impossible (that is, unprintable). In addition, when the additional additive is 100 parts by weight or more relative to 100 parts by weight by of PDMS, the degree of dispersion of the paste 100 to be manufactured may be reduced. That is, when the additional additive is supplied at a certain level or more relative to the PDMS, the degree of dispersion of the paste 100 to be manufactured may be reduced. As a result, a decrease in degree of dispersion may cause a decrease in the mechanical stability and electrical performance of the flexible electrode implemented through the paste 100. Accordingly, according to the present disclosure, it is possible to manufacture a paste 100 which guarantees mechanical stability and electrical performance of a certain level or more by restricting the additional additive from exceeding 100 parts by weight relative to 100 parts by weight of the PDMS during the process of manufacturing the paste.

That is, in the process of manufacturing the paste 100, the paste 100 which guarantees improved mechanical stability and electrical performance may be manufactured by limiting the addition proportion or amount of the additional additive (that is, 90 to 100 parts by weight of the additional additive relative to 100 parts by weight of the PDMS).

In one embodiment, the DEG 150 may be used as an auxiliary solvent when the paste 100 is manufactured. That is, the chloroform 140 may be added together with DEG 150 again in the operation S140.

According to one embodiment of the present disclosure, the DEG 150 may improve electrical performance. Specifically, the DEG 150 may cause an improvement in electrical performance through a percolation effect through interconnection with other elements in the paste 100. Specifically, the DEG 150 may promote the interaction of the metal conductor 110 through the percolation effect to improve electrical conductivity.

The improvement in overall electrical conductivity of the paste 100 as the DEG 150 is added can be seen through the experimental results as shown in FIGS. 6A and 6B. Specifically, FIG. 6A illustrates a graph related to a measured value of electrical conductivity according to a change in silver content and whether or not the DEG 150 is added. Further, FIG. 6B illustrates a graph related to a measured value of electrical conductivity according to a change in an addition amount of the MWCNT and whether or not the DEG 150 is added.

According to one embodiment, when the silver content is 85 wt %, as shown in FIG. 6A, it can be seen that high conductivity (that is, high viscosity) is acquired regardless of whether or not the DEG 150 is included or the degree of including the DEG 150. However, when the silver content is 85 wt %, as the overall viscosity of the paste increases and the boiling point decreases, the printing process may be difficult (that is, unprintable).

Accordingly, the metal conductor 110 constituting the paste 100, that is, the silver, may be provided in an amount of 230 to 400 parts by weight relative to 100 parts by weight of the PDMS. Here, 230 to 400 parts by weight relative to 100 parts by weight of the PDMS may refer to 70 wt % to 80 wt % relative to 1 g of the PDMS when represented as a mass unit. That is, the paste 100 may be provided with a viscosity and boiling point that enable the printing process by providing the silver in 230 to 400 parts by weight relative to 100 parts by weight of the PDMS (or 70 wt % to 80 wt % relative to 1 g of the PDMS). In other words, the paste 100 may maintain a viscosity (for example, 6.36 McP) and boiling point appropriate for printing by determining the proportion of silver relative to the PDMS 130.

Referring to FIG. 6A, when the DEG 150 is not added (that is, w/o (without) DEG), even when the silver content is sequentially increased to 70 wt %, 75 wt %, and 80 wt %, it can be seen that the electrical conductivity is 1000 S/cm or less, and electrical performance is not significantly improved. That is, when the DEG 150 is not added, electrical conductivity may be as low as 1000 S/cm or less even when the content of silver, which is a conductor, is increased to 80 wt %.

Further, when the DEG 150 is added in small amounts at 0 phr (parts per hundred resin, weight of an additive added per 100 parts by weight of a polymer) (that is, w(with) DEG, 0 phr) or added at 1 phr (that is, w DEG, 1 phr), as the silver content is sequentially increased to 70 wt %, 75 wt %, and 80 wt %, it can be seen that electrical conductivity is increased. That is, when the DEG 150 is added, it can be seen that a significant increase in electrical conductivity is caused as the silver content is increased from 70 wt % to 80 wt %.

Additionally, referring to FIGS. 7A and 7B, when the DEG 150 is added, it can be seen once again that electrical conductivity is improved. FIG. 7A is a result of measuring the distribution of the conductor (that is, silver) and silicon (that is, Si) disposed on a surface when the DEG 150 is added (that is, w (with) DEG), and FIG. 7B is a result of measuring the distribution of the conductor (that is, silver) and silicon (that is, Si) disposed on the surface when the DEG 150 is not added (that is, w/o (without) DEG). As shown in FIGS. 7A and 7B, it can be seen that surface distribution in the case in which the DEG 150 is added is 94.15%, which is higher than a surface distribution of 84.05% in the case in which the DEG 150 is not added. That is, it can be seen that when DEG 150 is added, electrical conductivity may be improved as more particles are distributed on the surface.

According to one embodiment of the present disclosure, 5 to 20 parts by weight of the MWCNT 120 relative to 100 parts by weight of the PDMS 130 may be provided. Here, 5 to 20 parts by weight relative to 100 parts by weight of the PDMS may mean 0.5 phr to 2 phr relative to 1 g of the PDMS. As a specific example, a provision amount of the MWCNT 120 relative to 1 g of the PDMS 130 may be limited to 5 mg to 20 mg.

In an additional embodiment, referring to FIG. 6B, when DEG 150 is added (that is, w/DEG), it can be seen that there is no difference in electrical conductivity even when the addition amount of the MWCNT 120 is changed. That is, when the DEG 150 is added, it can be seen that electrical conductivity is maintained at a high level even when the addition amount of the MWCNT 120 is changed.

Further, when the DEG 150 is not added (that is, w/o DEG), it can be seen that electrical conductivity is greatly improved in response to the addition amounts of MWCNT 120, that is, 0 phr, 1 phr, and 2 phr, respectively. In other words, when the DEG 150 is not added, when the addition amount of MWCNT 120 is relatively small, it can be seen that electrical conductivity is very low (for example, 1000 S/cm or less).

That is, according to the experimental results in FIG. 6B, when the DEG 150 is added, it can be seen that electrical conductivity of a high level is secured regardless of the change in addition amount of the MWCNT 120.

In summary, when the DEG 150 is added during the process of manufacturing the paste 100, electrical conductivity may be greatly improved according to an increase in the content of the metal conductor (that is, silver) in a line which maintains appropriate viscosity (that is, 230 to 400 parts by weight of the silver relative to 100 parts by weight of the PDMS). In addition, when the DEG 150 is added during the process of manufacturing the paste 100, electrical conductivity of a high level may be secured regardless of the degree of addition of the MWCNT 120. That is, as the DEG 150 is added, since the electrical conductivity of the paste 100 may be secured at a high level, electrical performance may be improved. For example, as shown in FIGS. 6A and 6B, the electrical conductivity of the paste 100 according to the addition of the DEG 150 may be up to 3460 S/cm. In other words, electrical performance may be maximized within the printable viscosity through the addition of the DEG 150.

Further, the improvement in the mechanical stability of the paste 100 as the DEG 150 is added can be seen through the experimental results shown in FIG. 8. FIG. 8 is a graph of experimental results illustrating changes in resistance values according to mechanical strain. Specifically, FIG. 8 is a graph related a resistance value which is changed according to a strain corresponding to whether or not the DEG is included and the inclusion information. When the experimental results are confirmed with reference to FIG. 8, when 1 phr of the DEG is added, it can be seen that a width of the increase in the resistance value is the smallest even when the strain is increased. That is, since the DEG is added, the increase in the resistance value is small even with frequent deformation (for example, repeated elongation), and thus mechanical stability may be maximized.

According to one embodiment of the present disclosure, the amount of the chloroform 140 constituting the paste 100 may be limited to 10 ml to 40 ml. Specifically, an inappropriate process time and dispersion of the paste 100 may be caused according to a provision amount of the chloroform 140. For example, when the amount of the chloroform 140 is less than 10 ml, or more than 40 ml, the inappropriate process time and dispersion of the paste 100 may be caused.

Specifically, when the amount of the chloroform 140 is less than 10 ml, the degree of dispersion of the paste 100 to be manufactured may be reduced. As a result, the decrease in the degree of dispersion may cause a decrease in the mechanical stability and electrical performance of the flexible electrode implemented through the paste 100. Accordingly, in the present disclosure, the chloroform 140 may be provided in excess of 10 ml during the process of manufacturing the paste. Further, when the amount of the chloroform 140 is more than 40 ml, a long process time of the paste 100 to be manufactured may be caused. For example, when the amount of the chloroform 140 is more than 40 ml, since the amount of the chloroform 140 which should be evaporated at room temperature through the stirring process increases, a long process time of 60 hours or more may be required. Accordingly, in the present disclosure, the paste 100 may be manufactured through a relatively short process time by limiting the providing amount of the chloroform 140 to 10 ml to 40 ml in the manufacturing process of the paste 100, and the paste 100 which ensures mechanical stability and electrical performance at a certain level or more may be manufactured.

According to one embodiment of the present disclosure, a ratio of the PDMS 130, the metal conductor 110, the chloroform 140, and the DEG 150 constituting the paste 100 may be 1:4:0.6:0.3.

More specifically, the metal conductor 110 constituting the paste 100, that is, the silver, may be provided in an amount of 230 to 400 parts by weight relative to 100 parts by weight of the PDMS. Here, 230 to 400 parts by weight relative to 100 parts by weight of the PDMS may refer to 70 wt % to 80 wt % relative to 1 g of the PDMS when represented as a mass unit. That is, the paste 100 may be provided with a viscosity and boiling point that enable the printing process by providing silver in an amount of 230 to 400 parts by weight relative to 100 parts by weight of the PDMS (or 70 wt % to 80 wt % relative to 1 g of the PDMS). In other words, the paste 100 may maintain the viscosity (for example, 6.36 McP) and boiling point appropriate for printing by determining the proportion of silver relative to the PDMS 130. In the embodiment, when silver is included in an amount of 400 parts by weight relative to 100 parts by weight of the PDMS (that is, 80 wt % of the silver relative to 1 g of the PDMS), the improvement in electrical conductivity may be maximized.

Further, the additional additive may be provided in an amount of 90 to 100 parts by weight relative to 100 parts by weight of the PDMS. Here, the additional additive may be configured through a 2:1 ratio combination of the chloroform 140 and the DEG 150. For example, the chloroform 140 and the DEG 150 may be provided in amounts of 0.6 g and 0.3 g, respectively, relative to 1 g of the PDMS 130. According to the embodiment, when the amount of the additional additive is less than 0.9 g, or more than 1 g, an unsuitable viscosity or degree of dispersion of the paste 100 to be manufactured may be caused.

According to the present disclosure, it is possible to manufacture the paste 100 which guarantees mechanical stability and electrical performance of a certain level or more by restricting the additional additive from exceeding 100 parts by weight relative to the 100 parts by weight of the PDMS during the process of manufacturing the paste.

That is, in the process of manufacturing the paste 100, the paste 100 which guarantees improved mechanical stability and electrical performance may be manufactured by limiting the addition ratio or amount of the additional additive (that is, 90 to 100 parts by weight of the additional additive relative to 100 parts by weight of the PDMS). Specifically, the paste 100 is transformed to a viscosity suitable for printing by the operation S140. That is, the viscosity is lowered compared to the conventional one.

In summary, a paste capable of implementing a low-resistance, high-stability flexible electrode may be manufactured through a provision ratio between the above-described components. That is, since the electrode manufactured through the paste of the present disclosure has excellent electrical performance, and guarantees a stable mechanical strain rate, and a printing process is possible, design freedom may be improved.

According to various embodiments of the present disclosure, the present disclosure can provide a paste capable of implementing a low-resistance, high-stability flexible electrode.

Since the electrode manufactured through the paste of the present disclosure has excellent electrical performance, and guarantees a stable mechanical strain rate, and a printing process is possible, it can be used in various applications such as a flexible display, a medical sensor attached to skin of a soft robot, or the like.

Effects of the present disclosure are not limited to the above-mentioned effects, and other effects which are not mentioned will be clearly understood by those skilled in the art from the above disclosure.

In the above, although embodiments of the present disclosure have been described with reference to the accompanying drawings, those skilled in the art may understand that the present disclosure may be embodied in other specific forms without changing the technical spirit or essential features thereof. Accordingly, it should be understood that the above-described embodiments are exemplary in all respects and not restrictive.

The specific implementations described in the present disclosure are examples, and do not limit the scope of the present disclosure in any way. For brevity of the specification, a disclosure of conventional electronic components, control systems, software, and other functional aspects of the systems may be omitted. Further, the connection or connection members of the lines between the components shown in the drawings exemplarily represent functional connections and/or physical or circuit connections, and in an actual device, may be referred to as various functional connections, physical connections, or circuit connections which can be replaced or added. In addition, unless there is a specific mention such as "essential", "importantly", or the like, it may not be a necessary component for the application of the present disclosure.

It will be understood that the specific order or hierarchy of steps in the presented processes is an example of exemplary approaches. Based on design priorities, it will be understood that the specific order or hierarchy of steps in the processes may be rearranged within the scope of the present disclosure. The accompanying method claims present elements of the various steps in a sample order, but are not meant to be limited to the presented specific order or hierarchy.

The description of the presented embodiments is provided so that those skilled in the art may use or carry out the present disclosure. Various modifications for these embodiments will be readily apparent to those skilled in the art, and the general principles defined herein may be applied to other embodiments without departing from the scope of the present disclosure. Accordingly, the present disclosure is not limited to the embodiments presented herein, but should be understood in the widest scope consistent with the principles and novel features presented herein.

What is claimed is:

1. A method of manufacturing a paste, comprising:
   an operation of adding a metal conductor and a multi-walled carbon nanotube (MWCNT) to chloroform (CHCl$_3$) to produce a first mixture;
   an operation of adding polydimethylsiloxane (PDMS) to the first mixture to produce a second mixture;
   an operation of evaporating the chloroform in the second mixture to acquire a third mixture; and
   an operation of adding an additional additive to the third mixture to produce a paste,
   wherein:
   the additional additive is composed of a first combination of the chloroform and diethylene glycol (DEG), and the additional additive is provided in an amount of 90 to 100 parts by weight relative to 100 parts by weight of the PDMS; and
   the chloroform is included at a greater mass than the DEG in the first combination, and an amount of the chloroform constituting the paste is limited to 10 ml to 40 ml.

2. The method of claim 1, wherein in the operation of producing the first mixture, the metal conductor and the MWCNT are dispersed in the chloroform through sonication.

3. The method of claim 2, wherein in the operation of producing the first mixture, the MWCNT is included in an amount of 5 to 20 parts by weight relative to 100 parts by weight of the PDMS.

4. The method of claim 1, wherein in the operation of producing the second mixture, the PDMS is dispersed in the first mixture through a paste mixing process.

5. The method of claim 1, wherein the operation of acquiring the third mixture includes acquiring the third mixture by performing a stirring process on the second mixture to cause room temperature evaporation of the chloroform.

6. The method of claim 1, wherein a ratio of the PDMS, the metal conductor, the chloroform, and the DEG constituting the paste is 1:4:0.6:0.3.

7. The method of claim 6, wherein:
   the metal conductor includes silver (Ag) having conductivity and implemented as a plurality of microscale particles; and
   the silver constituting the paste is provided in an amount of 230 to 400 parts by weight relative to 100 parts by weight of the PDMS.

* * * * *